United States Patent [19]

Scheingold et al.

[11] 4,018,494
[45] Apr. 19, 1977

[54] INTERCONNECTION FOR ELECTRICALLY CONNECTING TWO VERTICALLY STACKED ELECTRONIC PACKAGES

[75] Inventors: William Samuel Scheingold, Palmyra; Frank Christian Youngfleish, Harrisburg, both of Pa.

[73] Assignee: AMP Incorporated, Harrisburg, Pa.

[22] Filed: June 10, 1975

[21] Appl. No.: 585,440

[52] U.S. Cl. .......................... 339/17 CF; 339/17 M
[51] Int. Cl.² ......................................... H05K 1/07
[58] Field of Search ....... 339/17 CF, 17 LM, 17 M; 174/52 FP; 317/101 CM, 101 CC, 101 D, 101 DH

[56] References Cited
UNITED STATES PATENTS

| | | | |
|---|---|---|---|
| 3,212,047 | 10/1965 | McDonough | 339/17 CF |
| 3,340,439 | 9/1967 | Menschen et al. | 317/101 D |
| 3,409,857 | 11/1968 | O'Neill et al. | 339/17 CF |
| 3,754,203 | 8/1973 | Pauza et al. | 339/17 CF |
| 3,871,736 | 3/1975 | Carter | 339/17 CF X |
| 3,912,984 | 10/1975 | Lockhart et al. | 339/17 CF X |

Primary Examiner—Roy Lake
Assistant Examiner—Mark S. Bicks
Attorney, Agent, or Firm—Allan B. Osborne

[57] ABSTRACT

This invention relates to an interconnector for retaining two vertically stacked electronic packages or the like and for electrically connecting them to a printed circuit board. More particularly the interconnector consists of a housing of insulating material and a plurality of contact members spaced around the sides of the housing. Each contact member contains two integral yet independently flexible contacts for engaging the stacked packages. In addition each contact member contains a single pin for printed circuit board interconnection.

9 Claims, 4 Drawing Figures

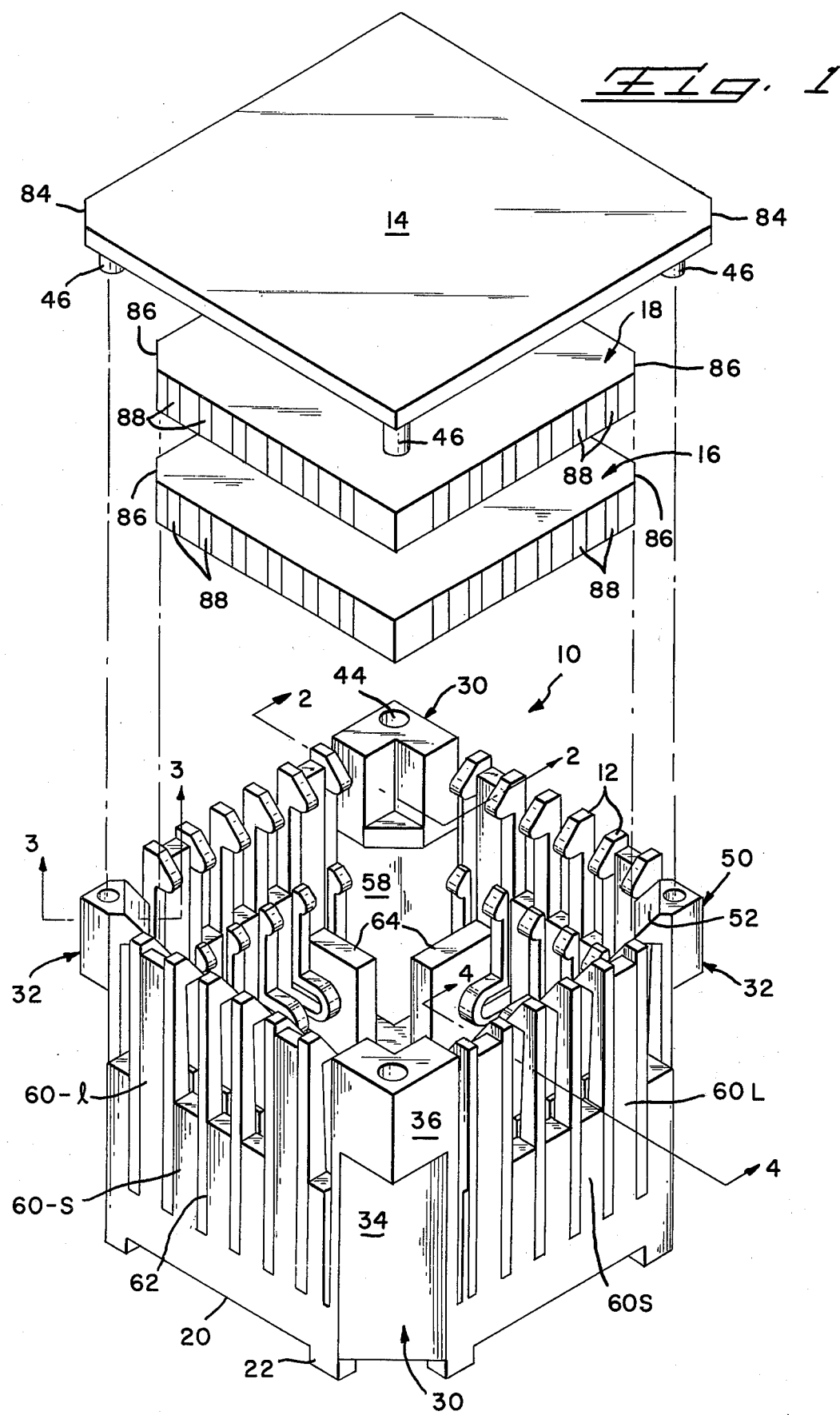

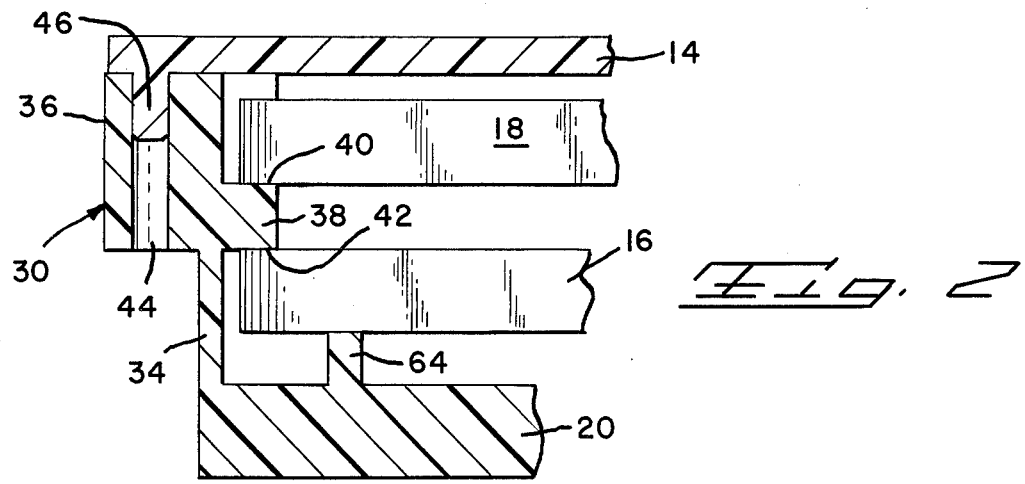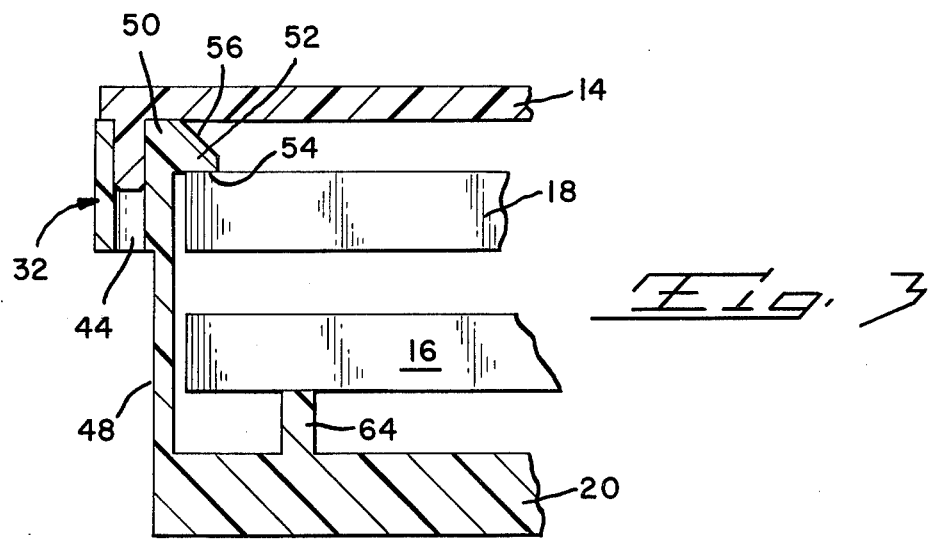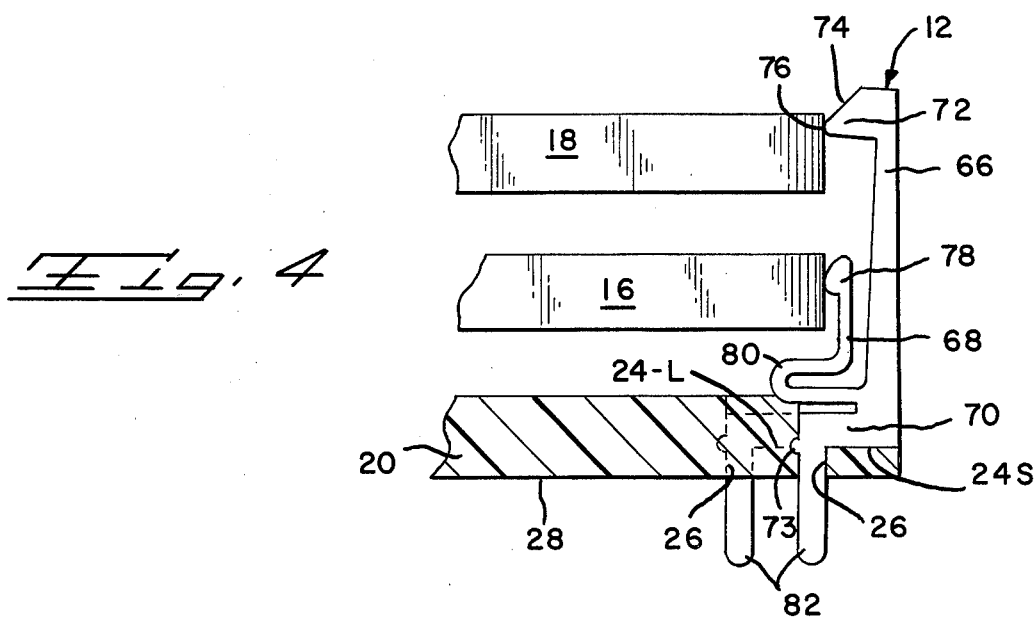

INTERCONNECTION FOR ELECTRICALLY CONNECTING TWO VERTICALLY STACKED ELECTRONIC PACKAGES

BACKGROUND OF THE INVENTION

The present invention relates generally to an interconnector and, more particularly, to an interconnector for connecting two electronic integrated circuit packages or the like having conductive pads on the sides thereof with a printed circuit board having conductive traces thereon.

Recently leadless integrated circuit packages have become more attractive for use on printed circuit boards due to high density and limited space requirements. The packages are of the type having conductive pads coated or deposited on a lower surface or along the sides. Low cost connectors are required to interconnect these packages to corresponding conductive traces on the printed circuit board.

A wide variety of connectors are available for such interconnecting. In the main, these assembles take the form of a housing containing rows of contact members each of which extend from a contact with a conductive pad on the package to a conductive trace on the printed circuit board. The form of the contact members correspond to whether the conductive pads are on the lower surface or on the sides of the packages. In any event, most of the current connector assemblies accept and interconnect a single package.

More recently, it has been necessary to increase the number of integrated circuit packages on a printed circuit board without increasing the area of the board. This requirement has lead workers in the field to stack packages one on top of the other. Whereas this approach solved the real estate problem, it introduced a host of other, more complicated problems. For example; height of the interconnector, strength of the contact members, the ability of the members to exert a high force against the pads on the packages without external help as well as a way to plug the interconnector onto a printed circuit board having a multitude of small conductive traces. Additionally, problems relating to housing strength, method of securing the packages in the housing, cooling the packages and so forth had to be met. Last but not least, an interconnector must be reliable, simple to use and economical to make.

Accordingly, it is an object of the present invention to provide an interconnector having a low horizontal and vertical profile which will interconnect two, stacked integrated circuit packages to a printed circuit board.

Another object of the present invention is to provide an interconnector wherein each contact member contains a dual set of contacts for engaging the conductive pads of two IC packages, one overlying the other.

Still another object of the present invention is to provide an interconnector wherein the several contact members exert a high force against the conductive pads on the IC packages so that contacts with inexpensive non-noble plating may be used.

Yet another object of the present invention is to provide an interconnector having a high degree of reliability and is economical to manufacture.

A further object of the present invention is to provide an interconnector wherein the two contacts on each contact member are independently flexible.

Still a further object of the present invention is to provide an interconnector wherein the housing includes self-contained means for supporting and retaining the stacked IC packages.

Still another object of the present invention is to provide an interconnector wherein the housing has open slots to permit the circulation of cooling air.

These and various additional objects and advantages of the present invention will become readily apparent from the following descriptions.

BRIEF DESCRIPTION OF THE DRAWINGS

FIG. 1 is a perspective view of the interconnector constructed in accordance with the preferred embodiment of the present invention;

FIGS. 2 and 3 are cross-sectional views taken along lines 2—2 and 3—3 respectively on FIG. 1 and showing the mechanical latching arrangement of the embodiment of FIG. 1; and FIG. 4 is a cross-sectional view taken along lines 4—4 on FIG. 1 showing the profile of a contact member of the present invention and further showing the electrical connecting arrangement, both being of the embodiment of FIG. 1.

DESCRIPTION OF THE PREFERRED EMBODIMENT

With reference to FIG. 1, the interconnector of the present invention consists of a housing 10, a plurality of contact members 12 and a cover 14. Lower leadless integrated circuit package, or simply substrate 16 and upper substrate 18 are shown between housing 10 and cover 14.

With reference to all figures, housing 10, molded from an insulating material such as glass filled nylon, has a base 20 from which a number of short legs 22 depend. A plurality of upwardly opening grooves 24 (FIG. 4) lead inwardly from the edge of the base along each of the four sides with alternating grooves extending inwardly a short distance more. The short grooves are designated 24-S and the longer ones are designated 24-L. All grooves terminate inwardly at a junction with vertical holes 26 which open out on the bottom surface 28 of the base. The staggered pattern is evident from the comparison of the dashed lines and solid lines in FIG. 4.

The four corners of housing 10 contain the substrate retaining means. The two diagonal pillars located on a plane perpendicular to the plane of the page retain lower substrate 16 and are designated pillars 30. One such pillar may be seen in cross-section in FIG. 2. The two opposite diagonal pillars retain upper substrate 18 and are designated pillars 32. One of these pillars may be seen in cross-section in FIG. 3.

Turning to FIG. 2, each pillar 30 consists of a support member 34 extending upwardly from base 20 and a first retaining member 36 on top thereof. As the figure shows, the support member is thin in thickness and the retaining member is generally cubic in shape. The inside corner is recessed back and down to provide a ledge 38 having upper and lower shoulders 40 and 42 respectively. A hole 44 is located in the retaining member to receive a stud 46 depending from a corner of cover 14. Lower shoulder 42 retains lower substrate 16, while upper shoulder 40 supports substrate 18.

FIG. 3 illustrates the construction of a pillar 32 which has a support member 48 identical to support member 34. A second retaining member 50 rests on top. The outer boundary of the retaining member conform to the right angle configuration. The inside portion has a inwardly projecting arm 52 which provides a downwardly facing shoulder 54. The upper surface of the arm is beveled as indicated by reference numeral 56. As with the first retaining member 36, a hole 44 is located in the second retaining member to receive a stud 46 on cover 14. Lower shoulder 54 retains upper substrate 18.

As with pillar 30, the support member 48 on pillar 32 is thin-walled so that the pillars can be flexed outwardly to permit the insertion of the substrates 16 and 18 into the central cavity 58 located in housing 10.

The four sidewalls 60 of housing 10 are slotted to provide receptacles for the contact members 12. These slots, designated by reference numeral 62, are in alignment and connect with grooves 24 located along the sides of base 20. The aforementioned slots segment each wall 60 into a number of columns some of which extend only part way up to the top of the housing, hereinafter referred to as columns 60-S, while other columns extend upwardly almost to the top, hereinafter referred to as columns 60-L. In the preferred embodiment illustrated there are two long columns per side. These provide lateral support for the substrates by virtue of being long and relatively rigid. The short columns permit cooling air to circulate into and out of the central cavity.

Two short support posts 64 bracket each pillar 30 and 32. These posts extend into the central cavity from each column 60-L and provide a base on which the lower substrate 16 can be placed.

Contact members 12, one of which can be seen in cross-section in FIG. 4, line the four sides of housing 10 with the dual contact points facing into the central cavity.

The contact member design is such as to permit them to be stamped and formed from high strength beryllium copper flat stock and to possess high force characteristics in restricted spaces. Upper and lower contact fingers 66 and 68 respectively extend upwardly from a common base or strap 70. The upper contact finger 66, extending almost to the top of the housing and being preloaded to bend into the central cavity, contains the upper contact point 72 which engages the upper substrate 18. The point itself has a beveled upwardly facing surface 74. The nose 76 on the contact point 72 is preferably rounded. The long length of upper contact finger 66 provides high deflection capability.

The lower contact finger 68 extends upwardly the distance required to engage the conductive pad on lower substrate 16. A curved nose comprises the contact point 78 for the lower contact finger. The finger itself contains a reverse loop 80 in order to increase its active length so as to achieve maximum deflection capability.

Strap 70 lies at a right angle to the contact fingers and when assembled in the housing 10 lies in a groove 24. A leg or pin 82 extends downwardly from the free end of base 70 as FIG. 4 shows. Alternate bases 70 will be longer in length in order to fit into the longer grooves 24-L to conform to the aforementioned staggered pattern. Rounded projection 73 provides an interference fit within hole 26 to lock the contact in place.

Cover 14 preferably has the two opposing corners cut at an angle as indicated by reference numeral 84 to provide a keying means; i.e., these angled corners correspond with like corners 86 on substrates 16 and 18.

Each of the two substrates may be any kind of discrete electronic package having conductive pads 88 located along the sides thereof. The particular packages for which the preferred embodiment was developed are a 4K RAM on a ceramic substrate. Its size is 0.400 inches on a side and 0.045 inches thick.

The dimensions of the interconnector disclosed herein and which accepts the described substrates are:

| | | |
|---|---|---|
| Height | 0.395 inches | (including legs 22) |
| Side Length | 0.550 inches | |
| Distance Between Contact Member Centers | 0.050 inches | |
| Contact Member Thickness | 0.015 inches | |

The interconnector is assembled by placing contact members 12 into a slot 62 and pushing it down so that its pin 82 slides through a vertical hole 26 in base 20 and its base 70 lies in the groove 24. It is apparent that it would be impossible to place a contact member 12 having a long base into a short groove 24-S and vice versa. The dimensions of holes 26, grooves 24, slots 62 and projections 73 are all sized so as to securely hold the contact members in position under normal handling. As is well knwon in the art, the pins 82 may be soldered or otherwise firmly held in the printed circuit board by spring sockets or the like.

Cover 14 is securely placed onto housing 10 by snapping studs 46 into holes 44. The cover provides additional rigidity to the assembly as well as providing protection to the substrates.

The procedure and method of loading and retaining the two substrates demonstrate one of the several novel features of the present invention.

The pillars 30 are flexed outwardly and substrate 16 is lowered into central cavity 58 and positioned on support posts 64. Orientation is readily provided by matching the angled corners 86 on the substrate with the beveled surfaces 56 on pillars 32 which are being cammed outwardly by the substrate 16. After the substrate 16 is in place, pillars 30 are allowed to return to their normal upright position whereby ledge 38 rests on top of the lower substrate, holding such in a retained position in the central cavity as illustrated in FIG. 2. Pillars 32 will have returned also to their normal upright position.

Substrate 18 can now be placed into position by pushing it downwardly into the central cavity. As with the lower substrate, pillars 32 are cammed outwardly via their beveled surfaces 56. The substrate 18 is positioned on top of ledges 38; i.e., on upwardly facing shoulders 40, and is retained therein between those shoulders and the inwardly projection arms 52 on pillars 32 as shown in FIGS. 2 and 3.

As the substrates are being positioned in central cavity 58 the contact pads 88 are being wiped against the contact points which are biased inwardly toward the cavity as noted above. As is well known in the art, a wiping action insures a better electrical connection and is a requirement in a system using non-noble metal contact surfaces.

In summary, the invention disclosed herein teaches an interconnector which provides a means for increasing the density of electronic packages in a limited space. In the development of the interconnector, consideration was given to crowded conductive traces and pin-receiving holes on the printed circuit board, strength and correspondingly, deflection capabilities of the contact-carrying spring members and cooling requirements. Additionally on board protection for the electronic devices, polarizaion, and low profile requirements restricted or prevented the use of conventional means and methods of interconnecting the electronic packages. As a result of the rigid requirements and limiting parameters, a novel and useful electrical interconnector has been developed which advances the art with respect to not only interconnecting contact spring members but also to the housing concepts for retaining the electronic packages being interconnected. Therefore, foregoing detailed description has been given for clearness of understanding only, and no unnecessary limitations should be understood therefrom, as some modifications will be obvious to those skilled in the art.

What is claimed is:

1. An interconnecting device useful for connecting a first and second electronic package stacked vertically therein to a printed circuit board, which comprises:
    a. a housing of insulating material including a base and walls, said base having one or more support posts and a plurality of holes along each side thereof and the walls containing a plurality of vertical slots which are connected to the holes in the base by horizontal grooves, said housing further having pillars at each corner, said pillars having means thereon for supporting and retaining the first and second electronic packages which may be stacked in the housing in a spaced, overlying relation;
    b. a plurality of conductive spring members positioned in the housing, each spring member having an upper finger positioned in a slot, a base positioned in the horizontal groove and a pin extending through the hole and depending from the housing for connection to a printed circuit board, the top of the upper finger having an inwardly projecting nose comprising an upper contact point, said spring member further having a lower finger integral with the upper finger and having an inwardly projecting nose comprising a lower contact point, said upper and lower fingers being preloaded to bias the upper and lower contact points against conductive pads on the first and second electronic packages which may be positioned in the housing in overlying relation; and
    c. a cover removably positioned on the top of the housing.

2. The interconnecting device of claim 1 wherein the means for supporting and retaining two electronic packages in the housing include an inwardly projecting ledge on two diagonally opposing pillars, said ledge providing downwardly facing shoulders which overlie and restrain the first electronic package resting on the one or more support posts, and upwardly facing shoulders adapted to support the second electronic package.

3. The means of claim 2 further including inwardly projecting arms on the other two diagonally opposing pillars adapted to overlie and restrain the second electronic package.

4. The interconnecting device of claim 1 wherein the pillars on the housing are resiliently movable.

5. The interconnecting device of claim 1 wherein the lower finger includes a reverse loop thereby increasing the effective length of said finger.

6. The interconnecting device of claim 1 wherein alternate holes are displaced inwardly with respect to the adjacent holes with alternate pins on the spring members adapted to extend through the inwardly displaced holes.

7. An interconnector for electrically connecting two electronic packages having conductive pads on the sides thereof to a printed circuit board or the like, which comprises:
    a. a housing having a base with a plurality of holes located along each of the edges, and further having walls positioned about the perimeter of the base thereby defining a central upwardly opening cavity, said walls each having a plurality of vertical slots, and further said housing having support means for supporting and for retaining two electronic packages in a spaced-apart relation which may be vertically stacked in the cavity in the housing, said means including support posts extending upwardly from the base on which a first electronic package may rest and a first pair of vertical pillars extending upwardly from diagonal corners of the base, each having an inwardly projecting ledge with a downwardly facing shoulder adapted to overlie and retain the electronic package which may be resting on the posts and an upwardly facing shoulder on which another electronic package may rest; and
    b. a plurality of conductive spring members positioned in the plurality of slots in the walls with pins extending downwardly through the holes in the base, said pins being adapted to electrically engage conductive traces on a printed circuit board or the like, and further each of said spring members having two vertically extending, elongated fingers, one extending above the other, said fingers having on the surfaces facing the cavity, contact means for electrically engaging the conductive pads on the sides of the electronic packages which may be vertically stacked in the cavity in the housing, said fingers being preloaded to bias the contact means against the conductive pads.

8. The support means of claim 1 further including a second pair of vertical pillars extending upwardly from other diagonal corners of the base and each having an inwardly projecting arm thereon adapted to overlie and retain the electronic package which may be resting on the upwardly facing shoulders of the first pair of vertical pillars.

9. The means of claim 8 wherein the pillars may be resiliently deflected outwardly to permit the insertion of the electronic packages into the housing.

* * * * *